(12) United States Patent
Ho

(10) Patent No.: US 8,090,067 B2
(45) Date of Patent: Jan. 3, 2012

(54) CIRCUITS AND METHODS FOR CLOCK AND DATA RECOVERY

(75) Inventor: Peter Ho, Union City, CA (US)

(73) Assignee: Avago Technologies Fiber IP (Singapore) Pte. Ltd. (SG)

( * ) Notice: Subject to any disclaimer, the term of this patent is extended or adjusted under 35 U.S.C. 154(b) by 894 days.

(21) Appl. No.: 12/126,655

(22) Filed: May 23, 2008

(65) Prior Publication Data
US 2009/0290672 A1 Nov. 26, 2009

(51) Int. Cl.
*H03D 3/24* (2006.01)
(52) U.S. Cl. ........................................ 375/374; 375/375
(58) Field of Classification Search .................. 375/354, 375/371, 372, 373, 374, 375, 376, 316, 322, 375/324, 326, 327; 327/100, 141, 144, 146, 327/147
See application file for complete search history.

(56) References Cited

U.S. PATENT DOCUMENTS

| | | | | |
|---|---|---|---|---|
| 5,396,523 A * | 3/1995 | Hedberg | | 375/373 |
| 6,002,279 A * | 12/1999 | Evans et al. | | 327/144 |
| 6,496,556 B1 * | 12/2002 | Huehne et al. | | 377/2 |
| 6,873,670 B1 * | 3/2005 | Chiu | | 375/375 |
| 7,197,102 B2 | 3/2007 | Rhee et al. | | |
| 2003/0053565 A1 * | 3/2003 | Yang et al. | | 375/327 |
| 2005/0060616 A1 * | 3/2005 | Cho et al. | | 714/34 |
| 2005/0093591 A1 * | 5/2005 | Rhee et al. | | 327/156 |
| 2005/0242890 A1 * | 11/2005 | Wu et al. | | 331/18 |
| 2007/0063775 A1 * | 3/2007 | Frank et al. | | 331/2 |

OTHER PUBLICATIONS

Sidiropoulos et al., "SA 20.2: A Semi-Digital DLL with Unlimited Phase Shift Capability and 0.08-400MHz Operating Range," 1997 IEEE International Solid-State Circuits Conferen.
Ahmed et al., "A Multiple-Rotating-Clock-Phase Architecture for Digital Data Recovery Circuits Using Verilog-A," Behavioral Modeling and Simulation Workshop, 2005, Proceeding.
Sidropoulous, Stefanos, A Semidigital Dual Delay-Locked Loop, IEEE Journal of Solid-State Circuits, vol. 32, No. 11, Nov. 1997, pp. 1683-1692.

* cited by examiner

*Primary Examiner* — David C. Payne
*Assistant Examiner* — Vineeta Panwalkar

(57) ABSTRACT

A clock-data recovery circuit includes a phase rotator, a phase detector and a charge pump. The phase rotator receives first and second reference clocks and differential control signals. The phase rotator generates a modified clock signal responsive to the first and second reference clocks and the control signals. The phase detector receives a data signal and the modified clock signal. The phase detector generates a modified data signal and a phase error signal responsive to the data signal and the modified clock signal. The charge pump receives the phase error signal and generates the differential control signals, which direct the phase rotator to interpolate between select clock phases.

17 Claims, 11 Drawing Sheets

CIRCUITS AND METHODS FOR CLOCK AND DATA RECOVERY

BACKGROUND

Phase-locked loop (PLL) circuits and delay-locked loop (DLL) circuits are used in clock and data recovery (CDR) circuits. PLL circuits are used in systems where clock and data signals are recovered from a single serial stream of data. Ethernet, Fibre Channel and synchronous optical networking and synchronous digital hierarchy (SONET/SDH) communication systems are examples of systems that typically use PLL circuits in CDR circuits.

Traditional CDR circuits use a PLL (which includes a frequency detector, phase detector, charge pump, and a voltage-controlled oscillator (VCO)) to generate a clock signal from a received data signal and a reference frequency, such as the output from a crystal oscillator. PLL circuits can adjust for both changes in frequency and phase between the VCO output frequency and the data signal to lock the VCO to the received data signal. The frequency detector and the VCO often require a significant portion of the integrated circuit area when used to implement the CDR circuit. In addition, the VCO consumes a significant portion of the power required by a traditional CDR circuit that uses a PLL.

Traditional DLL circuits use a controllable delay line to adjust the phase of a clock source with respect to the data signal that the DLL circuit is trying to recover. Traditional DLL circuits cannot accommodate a frequency difference between disparate clock sources. Accordingly, a traditional DLL circuit is inappropriate for communication systems with multiple data channels that originate from different sources. Thus, present solutions for communication systems with co-located asynchronous data lines often employ a PLL based CDR circuit for each data line or channel.

For example, U.S. Pat. No. 7,197,102, hereinafter the '102 patent, describes a CDR circuit with a DLL adapted to recover data from a data stream and a PLL in communication with the DLL adapted to recover a clock signal from the data stream. The CDR circuit employs a DLL to separate the data retiming process from a clock signal recovery function, in which the clock signal is extracted from the data channel by a PLL. The PLL extracts the clock information from a noisy serial data stream, while the DLL performs data synchronization in the phase domain. While, the '102 patent shows a single PLL circuit that supports clock recovery for four different data channels, the '102 patent teaches away from methods using multiphase because multiphase operation is believed to result in poor jitter performance.

Therefore, it would be desirable to implement an effective CDR circuit with improved jitter performance, as well as reduced circuit area and power requirements for communication systems with co-located and asynchronous data channels.

SUMMARY

An embodiment of a clock-data recovery circuit includes a phase rotator, a phase detector and a charge pump. The phase rotator receives first and second reference clocks and first and second control signals. The phase rotator generates a modified clock signal in response to the first and second reference clocks and the control signals. The phase detector receives a data signal and the modified clock signal. The phase detector generates a modified data signal and a phase error signal in response to the modified clock signal and the data signal. The charge pump receives the phase error signal and generates the first and second control signals.

An embodiment of a method for clock-data recovery includes the steps of receiving a data signal, receiving a first reference clock signal, receiving a second reference clock out of phase with the first reference clock signal, generating a modified clock signal responsive to the first reference clock signal and the second reference clock signal, generating a modified data signal responsive to a timing relationship between the data signal and the modified clock signal, generating a phase error signal responsive to the timing relationship, using a multiple-channel charge pump responsive to the phase error signal to generate a pair of control signals and using the pair of control signals to adjust the modified clock signal.

The figures and detailed description that follow are not exhaustive. The disclosed embodiments are illustrated and described to enable one of ordinary skill to make and use the circuits and methods for clock and data recovery. Other embodiments, features and advantages of the circuits and methods will be or will become apparent to those skilled in the art upon examination of the following figures and detailed description. All such additional embodiments, features and advantages are within the scope of the circuits and methods as defined in the accompanying claims.

BRIEF DESCRIPTION OF THE FIGURES

The circuits and methods for clock and data recovery can be better understood with reference to the following figures. The components within the figures are not necessarily to scale, emphasis instead being placed upon clearly illustrating the principles involved in implementing the circuits and methods (e.g., the phase rotator and the charge pump). Moreover, in the figures, like reference numerals designate corresponding parts throughout the different views.

DETAILED DESCRIPTION

Figure 1:
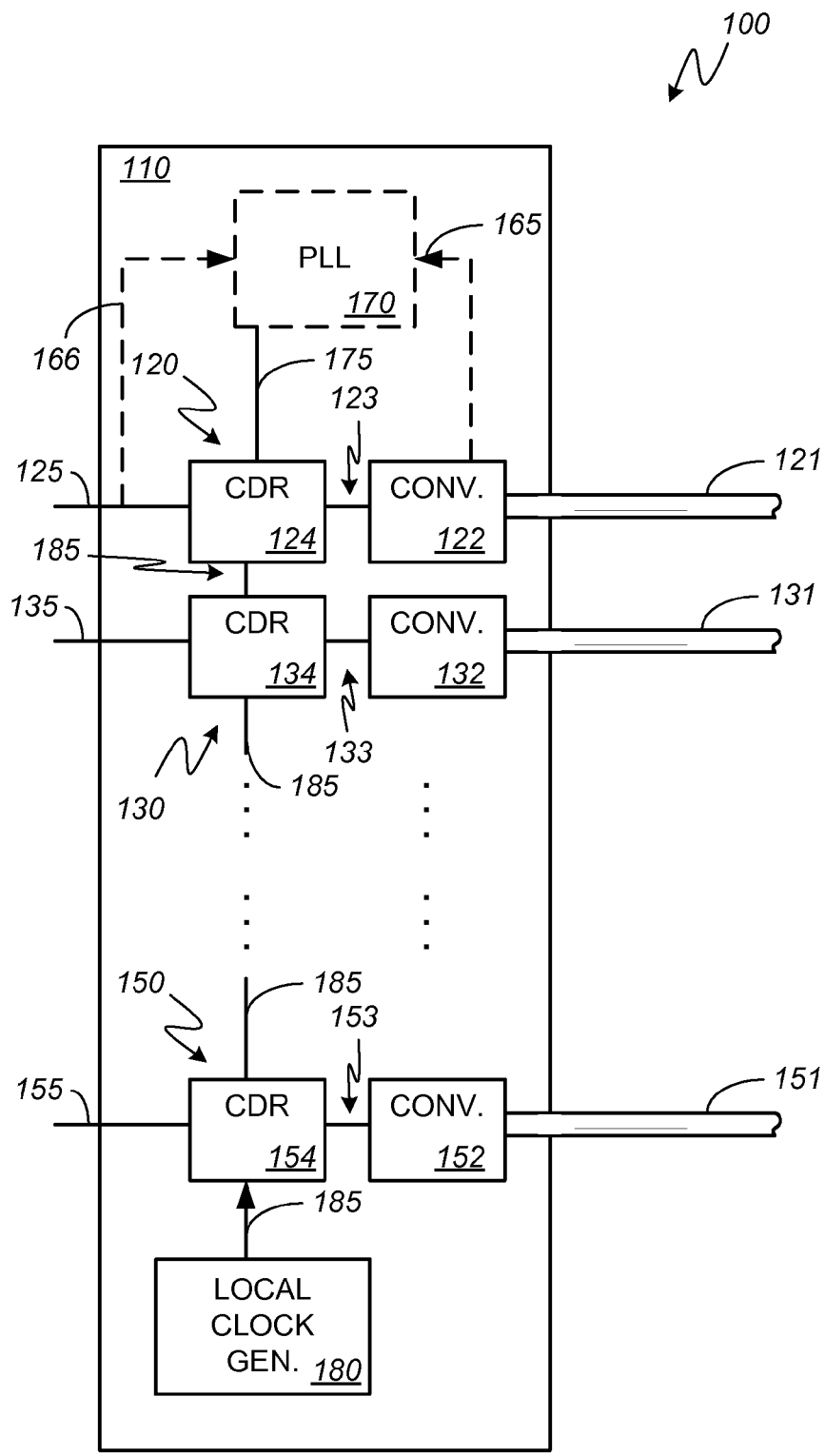
FIG. 1 is a simplified circuit diagram of an embodiment of a multiple-channel transceiver in a communication system.

Embodiments of circuits and methods for clock and data recovery include an improved phase rotator and charge pump.

The phase rotator is arranged to receive two reference clock signals that are out of phase with respect to one another. The phase rotator generates a modified clock signal in accordance with dual control signals generated by the charge pump. In an embodiment, the reference clock signals are approximately 90° out of phase. Embodiments of the improved phase rotator, charge pump and a logic element that interfaces with the charge pump to interpolate the phase difference between the reference clocks will vary in architecture and logic to support the various phase differences. The embodiments that follow are example implementations presented for clarity and ease of description. Other phase differences between the reference clock signals can be supported by modifications to the described embodiments of the phase rotator, charge pump and logic element.

The phase rotator can be a two-stage circuit device. The first stage includes a pair of 2-to-1 multiplexers used as analog mixers to interpolate between the two reference clocks. The first stage of the phase rotator is responsive to a first control signal from the charge pump. The second stage includes a single 2-to-1 multiplexer that interpolates between the respective outputs of the pair of 2-to-1 multiplexers from the first stage. In an embodiment, emitter degeneration resistors are added to the conductors carrying the first and second control signals from the charge pump to reduce tuning gain and to increase signal range. The first and second control signals enable gray code tuning (i.e., 00-01-11-10) through the entire range one bit at a time.

The charge pump is a multichannel device that provides the gray code in an analog fashion using the first and second control signals. Each channel includes a dedicated charge device and a respective window comparator. The window comparator associated with each channel determines whether the signal being processed is in a linear tuning range. The respective window comparators are differential comparators. Symmetric threshold values are set at the transitions between linear tuning and non-linear or limiting operation. Hysteresis is provided to prevent undesired transitions at the decision threshold. The window comparators generate two outputs. A first window comparator output indicates whether the tuning signal is above the set thresholds. A second window comparator output indicates whether the tuning signal is below the set thresholds. If either output is a logic high, the tuning voltage is in the limiting or nonlinear range of operation. A logic element receives the window comparator outputs and controls which channel is enabled and in which direction the associated charge device is driven to implement the gray code.

Reference is now directed to the drawings, including FIGS. 1-11, which illustrate exemplary embodiments of the circuits and methods for clock and data recovery.

FIG. 1 is a simplified circuit diagram of an embodiment of a transceiver 110 in a communication system 100. The transceiver 110 includes multiple channels for communicating data between coupled devices in the communication system 100. A first data channel 120 includes a fiber 121, an optical-to-electrical converter (i.e., CONV. or converter) 122 and a clock and data recovery (CDR) element 124. The converter 122 is coupled to the CDR element 124 via connection 123 and to an optical transmitter (not shown) via fiber 121. The optical transmitter may be in direct or indirect communication with the source of one or more of the received data channels. The CDR element 124 is further coupled to one or more electrical elements (not shown). The CDR element 124 enables communication between the one or more electrical elements and a remote device coupled to fiber 121 when a clock signal is not shared or otherwise communicated. In a receive mode, the one or more electrical elements process the data communicated from the optical transmitter. In a transmit mode, the one or more electrical elements forward an electrical signal to the converter 122, which converts the electrical signal to light, which is communicated to a photosensitive element along fiber 121.

A second data channel 130 includes a fiber 131, an optical-to-electrical converter or converter 132 and a CDR element 134. The converter 132 is coupled to the CDR element 134 via connection 133 and to an optical transmitter (not shown) via fiber 131. The CDR element 134 is further coupled to one or more electrical elements (not shown). The CDR element 134 enables communication between the one or more electrical elements and a remote device coupled to fiber 131 when a clock signal is not shared or otherwise communicated. In a receive mode, the one or more electrical elements process the data communicated from the optical transmitter. In a transmit mode, the one or more electrical elements forward an electrical signal to the converter 132, which converts the electrical signal to light, which is communicated to a photosensitive element along fiber 131.

An Nth data channel 150 includes a fiber 151, a optical-to-electrical converter or converter 152 and a CDR element 154. The converter 152 is coupled to the CDR element 154 via connection 153 and to an optical transmitter (not shown) via fiber 151. The CDR element 154 is further coupled to one or more electrical elements (not shown). The CDR element 154 enables communication between the one or more electrical elements and a remote device coupled to fiber 151 when a clock signal is not shared or otherwise communicated. In a receive mode, the one or more electrical elements process the data communicated from the optical transmitter. In a transmit mode, the one or more electrical elements forward an electrical signal to the converter 152, which converts the electrical signal to light, which is communicated to a photosensitive element along fiber 151.

A local clock generator 180 provides first and second reference clock signals along connection 185 to assist each respective CDR element in the process of recovering a respective data signal. As described above, the first and second reference clock signals are out-of-phase with respect to each other. As will be explained in greater detail below, the local clock generator 180 may include any number of signal sources suitable for generating the first and second reference clock signals.

In an alternative embodiment, a phase-locked loop (PLL) element 170 receives an electrical version of the clock signal from the first data channel 120. In a receive mode, the clock signal is received from converter 122 via connection 165. In a transmit mode, a clock signal is forwarded from connection 125 to the PLL element 170 via connection 166. The PLL element 170 uses a phase detector and a VCO to construct a clock signal from the received data signal. The clock signal is forwarded to one or more of CDR element 124, CDR element 134 and CDR element 154 via connection 175 and clock bus 185 to assist each respective CDR element in the process of recovering a respective data signal. This alternative embodiment is suitable for recovering data from multiple channels that originate from a common source element having a single clock.

This implementation is well suited to a DLL CDR because the incoming clock from PLL 170 would remain locked to the clock of the data source. However, the charge pump in this implementation could not be permitted to drift as the phase of the DLL CDR would drift from the locked position. When the PLL element 170 is used, a tri-state or digital charge pump could be used to generate control signals for directing the phase rotator to adjust the modified clock signal.

Figure 2:
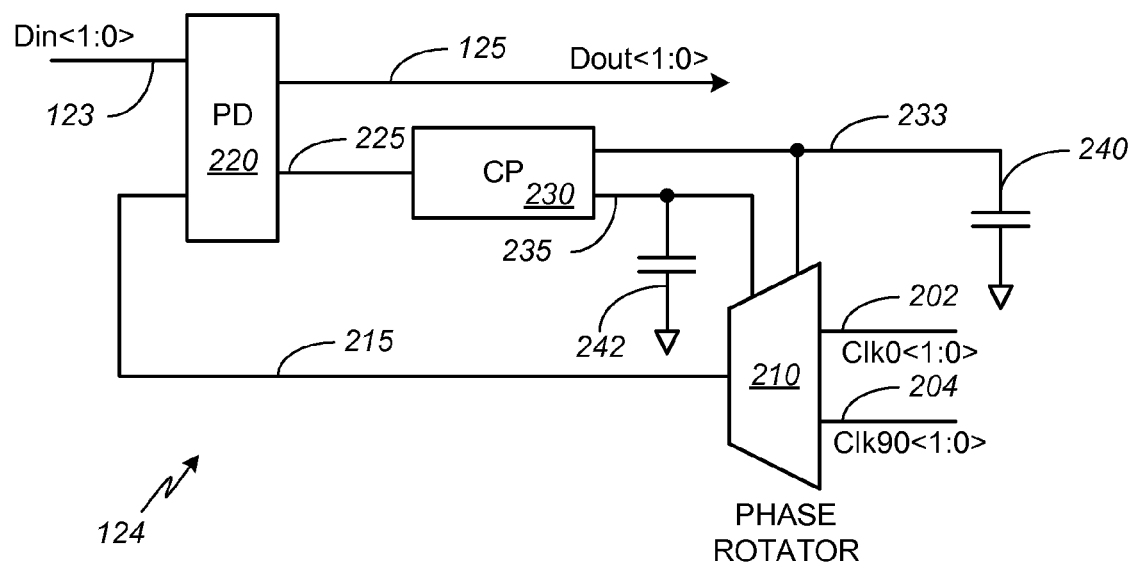
FIG. 2 is a circuit diagram of an embodiment of the clock-data recovery circuit of FIG. 1.

FIG. 2 is a circuit diagram of an embodiment of an example CDR element of FIG. 1. The CDR element 124 includes a phase rotator 210, a phase detector 220 and a multiple-channel charge pump 230. The CDR element 124 has three inputs and a single output. A first reference clock signal (Clk0<1:0>) is received along connection 202. A second reference clock signal (Clk90<1:0>) is received along connection 204. The second reference clock signal is approximately 90° out-of-phase with respect to the first reference clock signal. A data signal (Din<1:0>) is received along connection 123. The CDR element 124 generates a modified data signal (Dout<1:0>) on connection 125.

The phase rotator 210 is arranged to receive the first reference clock signal on connection 202 and the second reference clock signal on connection 204. The phase rotator 210 generates a modified clock signal on connection 215, which is coupled to an input of the phase detector 220. As will be explained in greater detail below, the phase rotator 210 generates a modified clock signal that is a phase adjusted representation of one or both of the first and second clock reference signals. The phase adjustment is performed in accordance with tuning or control signals generated within the charge pump 230. The charge pump 230 directs the rotator to forward one of the first reference clock signal on connection 202, the second reference clock signal on connection 204 or an inverted representation of one of these in a first mode of operation. Otherwise, the charge pump 230 directs the rotator to select and interpolate between two clock phases.

The phase detector receives the data signal on connection 123 and in accordance with the relative phase between the data signal and the modified clock signal, generates a phase error signal on connection 225. The phase detector 220 also generates the modified data signal on connection 125 in accordance with a timing relationship between the data signal on connection 123 and the modified clock signal on connection 215.

The phase error signal on connection 225 directs the charge pump to generate first and second control signals. A first control signal is coupled to the phase rotator 210 via connection 235. A second control signal is coupled to the phase rotator 210 via connection 233. The first control signal on connection 235 is filtered by a capacitance 242, which is applied between connection 235 and electrical ground. The second control signal on connection 233 is filtered by a respective capacitance 240, which is applied between connection 233 and electrical ground. In operation, the feedback provided by the phase error signal on connection 225 and the first and second control signals on connections 235 and 233, respectively, adjust the modified clock signal (on connection 215) such that the modified data signal (on connection 125) is an accurate representation of the intended data over time.

Figure 3A:
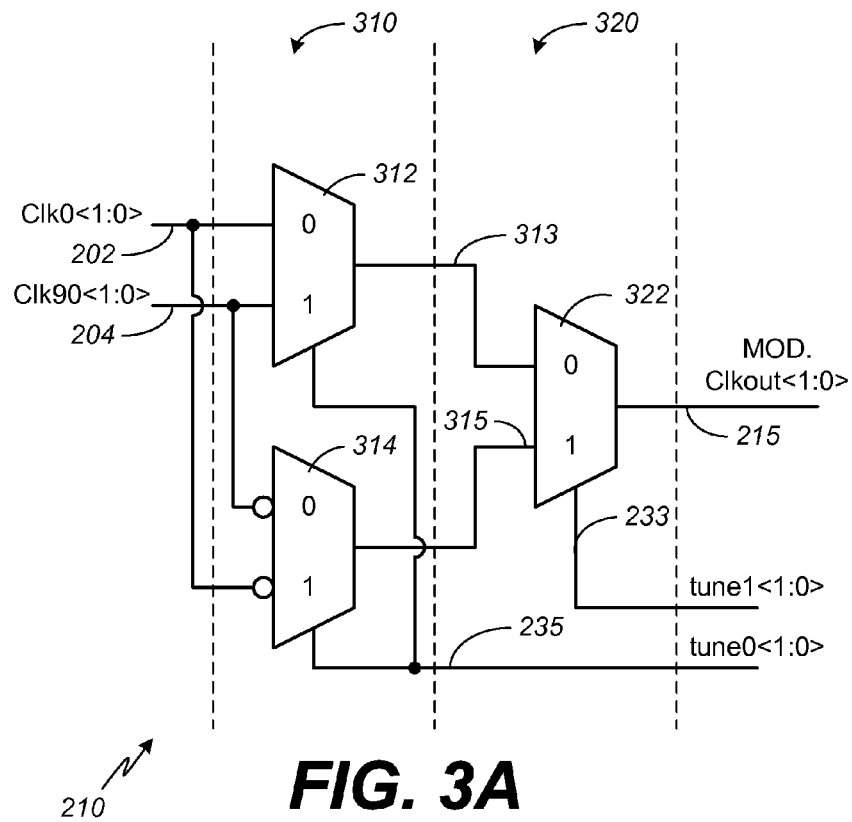
FIG. 3A is a circuit diagram of an embodiment of the phase rotator of FIG. 2.

FIG. 3A is a circuit diagram of an embodiment of the phase rotator 210 of FIG. 2. The phase rotator 210 is a two-stage device. A first stage 310 includes a first multiplexer 312 and a second multiplexer 314. A second stage 320 includes a third multiplexer 322. As indicated above, the phase rotator 210 receives four inputs and generates a single output. The four inputs include a first control signal (tune0<1:0>) on connection 235, a second control signal (tune1<1:0>) on connection 233, a first reference clock signal (Clk0<1:0>) on connection 202 and a second reference clock signal (Clk90<1:0>) on connection 204. The phase rotator 210 generates a modified clock signal (MODClkout<1:0>) on connection 215. Although the first and second control signals and the first and second reference clock signals are described as differential signals, a single-ended implementation can be substituted for the first and second control signals or the first and second reference clocks.

A first input of the first multiplexer 312 receives the first reference clock signal (Clk0<1:0>) on connection 202. A second input of the first multiplexer 312 receives the second reference clock signal (Clk90<1:0>) on connection 204. A control input of the first multiplexer 312 receives the first control signal (tune0<1:0>) on connection 235. A first input of the second multiplexer 314 receives the inverse of the second reference clock signal (Clk90<1:0>) on connection 204. A second input of the second multiplexer 314 receives the inverse of the first reference clock signal (Clk0<1:0>) on connection 202. The first multiplexer 312 and the second multiplexer 314 are tuning elements that can select one of the inputs or can interpolate between the input signals. When the first control signal (tune0<1:0>) is operating in a limiting range of operation, the multiplexer 312 will select one of its inputs depending on the polarity of the first control signal and forward a select one of the first reference clock signal and the second reference clock signal on connection 313. For example, the multiplexer 312 will select the input labeled "1" when the control signal is positive and the input labeled "0" when the control signal is negative.

When the first control signal (tune0<1:0>) is operating in a linear range of operation, the multiplexer 312 interpolates between the first and second reference clock signals. Similarly, when the first control signal (tune0<1:0>) is operating in a limiting range of operation, the multiplexer 314 will select one of its inputs depending on the polarity of the first control signal and forward a select one of the inverse of the first reference clock signal and the inverse of the second reference clock signal on connection 315. The multiplexer 314 will select the input labeled "1" when the control signal is positive and the input labeled "0" when the control signal is negative.

When the first control signal (tune0<1:0>) is operating in a linear range of operation, the multiplexer 314 interpolates between the inverted versions of the first and second reference clock signals. When the second control signal (tune1<1:0>) is operating in a limiting range of operation, the multiplexer 322 will select one of its inputs depending on the polarity of the second control signal and forward a select one of the signal on connection 313 or the signal on connection 315. The multiplexer 322 will select the input labeled "1" when the control signal is positive and the input labeled "0" when the control signal is negative.

When the second control signal (tune1<1:0>) is operating in a linear range of operation, the multiplexer 322 interpolates between the signal on connection 313 and the signal on connection 315. Operation of the first and second control signals is described in further detail in association with FIG. 5B.

Figure 3B:
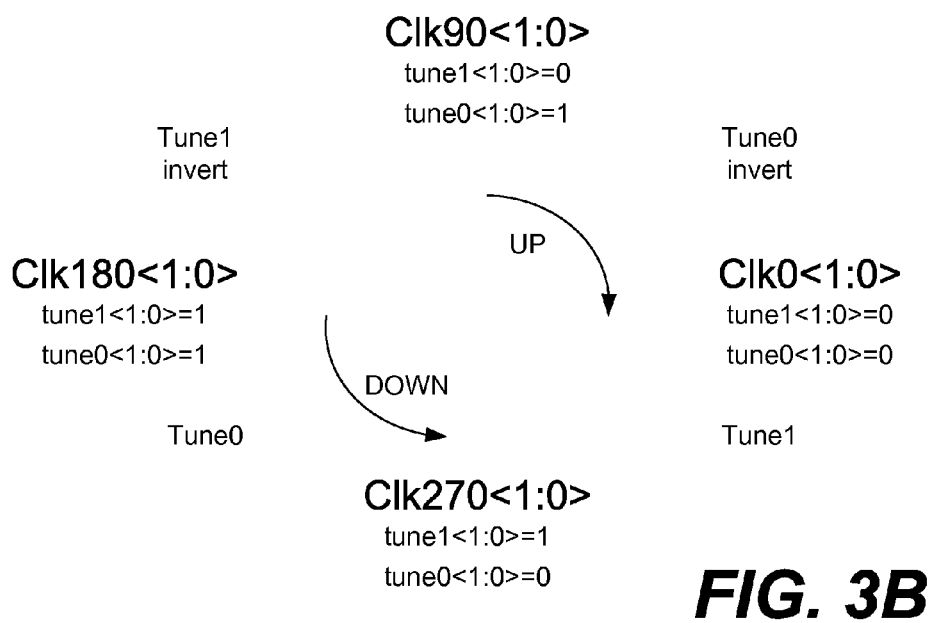
FIG. 3B is a schematic diagram illustrating operation of the phase rotator of FIG. 3A.

FIG. 3B is a schematic diagram illustrating operation of the phase rotator 210 of FIG. 2. The labels shown in relatively larger font at the 3 o'clock, 6 o'clock, 9 o'clock and 12 o'clock positions are representative of the four reference clock signals that can be selectively applied as the modified clock signal on connection 215 (FIG. 3A). Shown adjacent and underneath each of the reference clock signal positions are the tuning or control signal logic levels used to select the associated reference clock signals. The arrow labeled "UP" (i.e., clockwise rotation) is indicative of the direction taken to advance the clock phase. The arrow labeled "DOWN" (i.e., counter-clockwise rotation) is indicative of the direction taken to delay the clock phase.

Movement from the reference position (i.e., the 3 o'clock position) to the 90° position (i.e., the 12 o'clock position) on the diagram is associated with a relative delay of the clock phase by 90°. As indicated by the values of the tuning or control signals, the value of the first control signal (tune0<1:0>) transitions from logic "low" or zero to logic "high" or one, while the value of the second control signal (tune1<1:0>) remains unchanged. Therefore, to tune or adjust the phase of the clock from clk0<1:0> to clk90<1:0>, the differential voltage of the first control signal (tune0<1:0>) transitions from a logic low to a logic high. Since a delay in clock phase from clk0<1:0> to clk90<1:0> (movement in the down direction) is induced by a positive change in voltage in control signal tune0<1:0>, the transition is labeled "Tune0 invert." As indicated above, the control signal or tuning signal can achieve values between logic levels. As a result, any phase difference between 0° and 90° degrees can be achieved.

Movement from the 90° position (i.e., the 12 o'clock position) to the 180° position (i.e., the 9 o'clock position) on the diagram is caused by delaying the clock phase by an additional 90°. As indicated by the values of the tuning or control signals, the value of the second control signal (tune1<1:0>) transitions from logic "low" or zero to logic "high" or one, while the value of the first control signal (tune0<1:0>) remains unchanged. Therefore, to tune or adjust the phase of the clock from clk90<1:0> to clk180<1:0>, the differential voltage of the second control signal (tune1<1:0>) transitions from a logic low to a logic high. Since a delay in clock phase from clk90<1:0> to clk180<1:0> is induced by a positive change in voltage in control signal tune1<1:0>, the transition is labeled "Tune1 invert." As indicated above, the control signal or tuning signal can achieve values between logic levels. As a result, any phase difference between 90° and 180° degrees can be achieved.

Movement from the 180° position (i.e., the 9 o'clock position) to the 270° position (i.e., the 6 o'clock position) on the diagram is caused by delaying the clock phase by an additional 90°. As indicated by the values of the tuning or control signals, the value of the first control signal (tune0<1:0>) transitions from logic "high" or one to logic "low" or zero, while the value of the second control signal (tune1<1:0>) remains unchanged. Therefore, to tune or adjust the phase of the clock from clk180<1:0> to clk270<1:0>, the differential voltage of the first control signal (tune0<1:0>) transitions from a logic high to a logic low. Since a delay in clock phase from clk180<1:0> to clk270<1:0> is induced by a negative change in voltage in control signal tune0<1:0>, the transition is labeled "Tune0." As indicated above, the control signal or tuning signal can achieve values between logic levels. As a result, any phase difference between 180° and 270° degrees can be achieved.

Movement from the 270° position (i.e., the 6 o'clock position) to the reference position (i.e., the 3 o'clock position) on the diagram is caused by delaying the clock phase by an additional 90°. As indicated by the values of the tuning or control signals, the value of the second control signal (tune1<1:0>) transitions from logic "high" or one to logic "low" or zero, while the value of the first control signal (tune0<1:0>) remains unchanged. Therefore, to tune or adjust the phase of the clock from clk270<1:0> to clk0<1:0>, the differential voltage of the second control signal (tune1<1:0>) transitions from a logic high to a logic low. Since a delay in clock phase from clk270<1:0> to clk0<1:0> is induced by a negative change in voltage in control signal tune1<1:0>, the transition is labeled "Tune1." As indicated above, the control signal or tuning signal can achieve values between logic levels. As a result, any phase difference between 270° and 0° degrees can be achieved.

Figure 4:
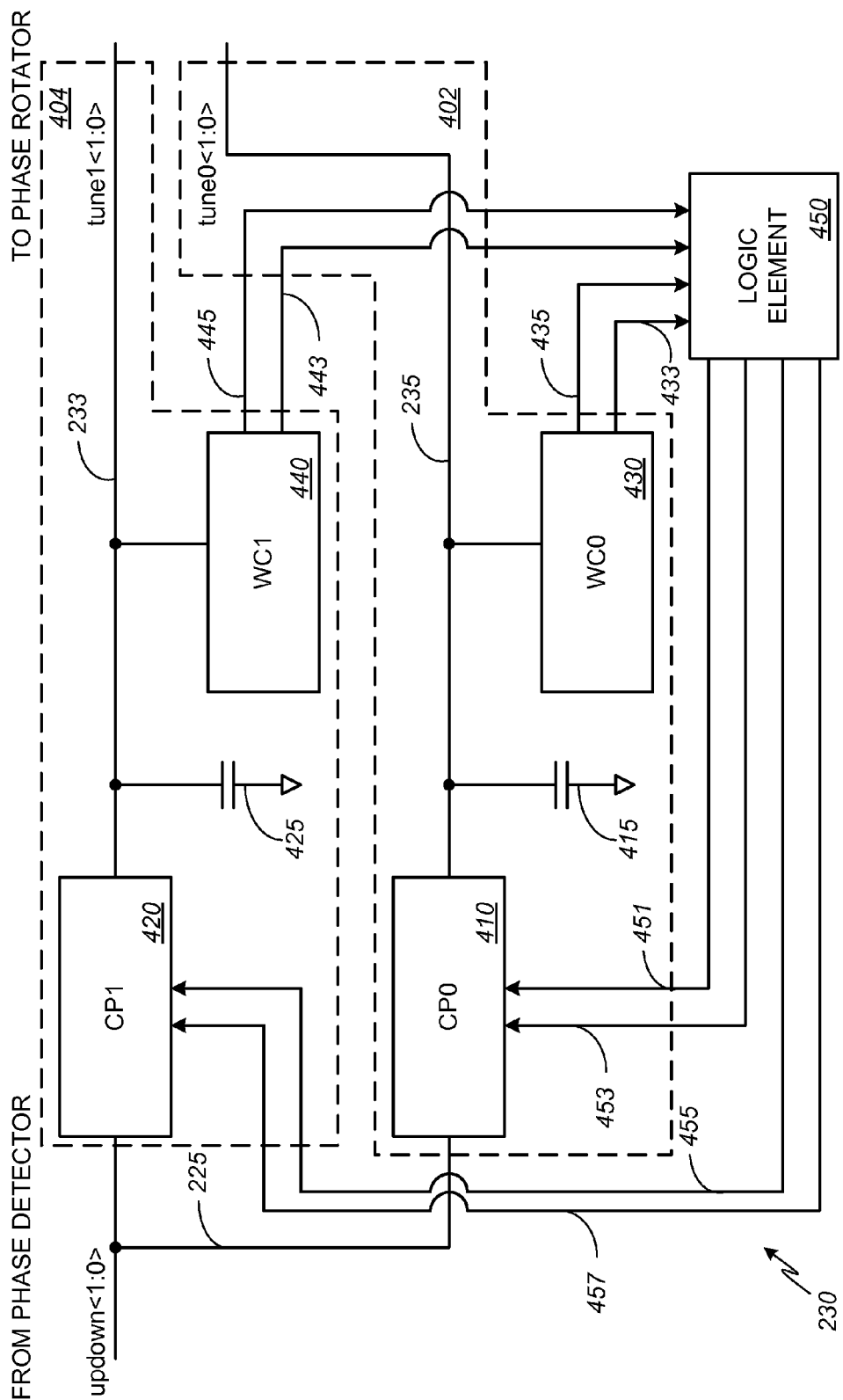
FIG. 4 is a circuit diagram of an embodiment of the multiple-channel charge pump of FIG. 2.
Figure 5:
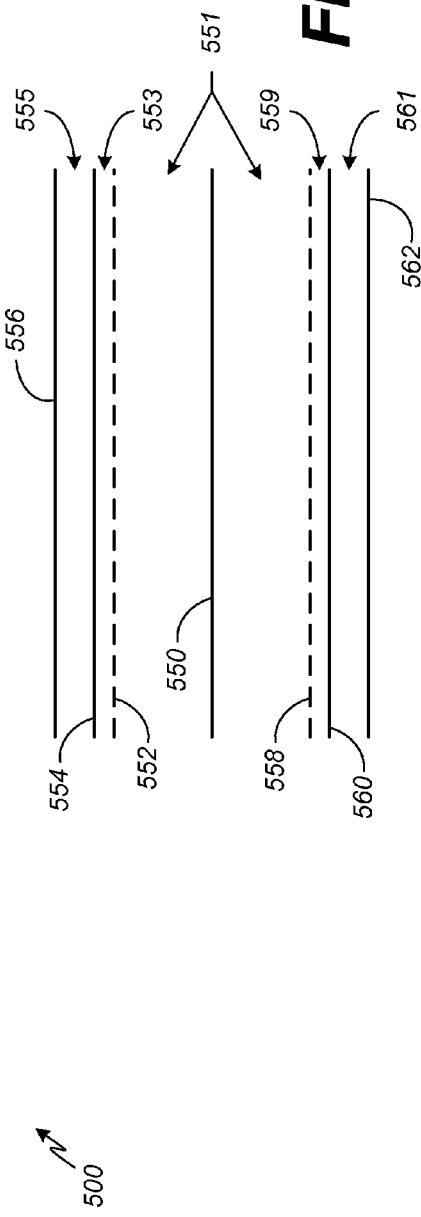
FIG. 5A is a table illustrating operation of the multiple-channel charge pump of FIG. 4.
FIG. 5B is a schematic diagram illustrating an embodiment of the relative voltages of the first and second control signals of FIG. 4.

FIG. 4 is a circuit diagram of an embodiment of the multiple-channel charge pump 230 of FIG. 2. The multiple-channel charge pump 230 includes a first channel 402 that generates the first control signal (tune0<1:0>) on connection 235 and a second channel 404 that generates the second control signal (tune1<1:0>) on connection 233. The multiple-channel charge pump 230 further includes a logic element 450 that determines which of the first channel 402 or the second channel 404 should be enabled/disabled and when the enabled channel output direction should be reversed or changed (indicated in FIG. 3B as "invert"). That is, the first and second control or tuning signals determine the direction the charge pump drives it output given the voltage of the phase error signal.

The first channel 402 includes a first charge pump 410 and a first window comparator 430. The first charge pump 410 receives the phase error signal (updown<1:0>) on connection 225. A first charge pump control signal is received along connection 451 from logic element 450. The first charge pump control signal on connection 451 enables/disables the first charge pump 410. A second charge pump control signal is received along connection 453 from the logic element 450. The second charge pump control signal on connection 453 directs the first charge pump 410 to delay or advance the received phase error signal. The first charge pump 410 forwards the resulting tuning or first control signal (tune0<1:0>) to window comparator 430 via connection 235. The first control signal (tune0<1:0>) on connection 235 is filtered by a capacitance 415. For simplicity of illustration and description, the first control signal on connection 235 is shown as a single conductor. The first control signal (tune0<1:0>) is a differential signal on a pair of conductors.

The first window comparator 430 receives the filtered first control signal on connection 235 and generates a first window comparator output when the first control signal is above a first threshold value. The first window comparator output is forwarded to the logic element 450 on connection 433. The first window comparator 430 further generates a second window comparator output when the first control signal is below a second threshold value. The second window comparator output is forwarded to the logic element 450 on connection 435.

The first window comparator 430 is a differential voltage comparator. That is, the first window comparator 430 determines a difference between two voltages (rather than the absolute voltage of a single signal). The first control signal (tuning0<1:0>) is a differential signal, which means there are actually two signals that move opposite in polarity to each other. The difference between the two voltages of the differential signal can be positive or negative depending on which of the differential signals is greater. Accordingly, the first window comparator 430 has a first or upper threshold and a second or lower threshold that are symmetric about 0V (e.g. +0.25V and −0.25V). When the voltage difference between the differential signals is greater than the upper threshold (e.g. greater than +0.25V), the "above" output is a logic 1. When the voltage difference between the differential signals is less than the lower threshold (e.g., less than −0.25V), the "below" output is a logic 1.

The first window comparator 430 is configured to apply a hysteresis around the threshold voltages (i.e., +0.25V and −0.25V) such that as the difference of the differential signals goes above the upper threshold voltage (i.e., +0.25V), the first window comparator output or "above" signal becomes a logic 1. Thereafter, for the first window comparator output or "above" signal to transition to logic 0, the difference of the differential signals would have to fall below the upper threshold by the hysteresis voltage value. If the hysteresis voltage is 0.01V and the upper threshold is +0.25V, the difference of the differential signals would have to fall below 0.24V to change the "above" signal to 0.

The second channel 404 includes a second charge pump 420 and a second window comparator 440. The second charge pump 420 receives the phase error signal (updown<1:0>) on connection 225. A first charge pump control signal is received along connection 455 from logic element 450. The first charge pump control signal on connection 455 enables/disables the second charge pump 420. A second charge pump control signal is received along connection 457 from the logic element 450. The second charge pump control signal on connection 457 directs the second charge pump 420 to delay or advance the received phase error signal. The second charge pump 420 forwards the resulting tuning or second control signal (tune1<1:0>) to window comparator 440 via connection 233. The second control signal (tune1<1:0>) on connection 233 is filtered by a capacitance 425. For simplicity of illustration and description, the second control signal on connection 233 is shown as a single conductor. The second control signal (tune1<1:0>) is a differential signal on a pair of conductors.

The second window comparator 440 receives the filtered second control signal on connection 233 and generates a third window comparator output when the second control signal is above a third threshold value. The second window comparator output is forwarded to the logic element 450 on connection 443. The second window comparator 440 further generates a fourth window comparator output when the second control signal is below a fourth threshold value. The fourth window comparator output is forwarded to the logic element 450 on connection 445.

The second window comparator 440 is a differential voltage comparator. That is, the second window comparator 440 determines a difference between two voltages (rather than the absolute voltage of a single signal). The second control signal (tuning1<1:0>) is a differential signal. The difference between the two voltages of the differential signal can be positive or negative depending on which of the differential signals is greater. Accordingly, the second window comparator 440 has a third or upper threshold and a fourth or lower threshold that are symmetric about 0V (e.g. +0.25V and −0.25V). When the voltage difference between the differential signals is greater than the upper threshold (e.g. greater than +0.25V), the "above" output is a logic 1. When the voltage difference between the differential signals is less than the lower threshold (e.g., less than −0.25V), the "below" output is a logic 1.

In an alternative embodiment, the charge pump 230 can be implemented via a digital circuit. In such an implementation, the phase detector error signal would be interpreted digitally and could be applied to a phase counter. The output of the phase counter would be decoded to drive digital-to-analog converters (DACs), which would generate the first and second control signals to adjust the phase rotator 210.

FIG. 5A is an embodiment of a table 500 illustrating operation of the multiple-channel charge pump 230 of FIG. 4. The table 500 provides further information on the operation of the logic element 450 by revealing the window comparator outputs and charge pump inputs to each of the channels of the multiple-channel charge pump 230 for specified conditions of the first control signal (tune0<1:0>) and the second control signal (tune1<1:0>). The state of the first and second control (tune) lines is displayed in the leftmost columns 510 of the table 500. Column 512 shows the state of the first control signal (tune0<1:0>). Column 514 shows the state of the second control signal (tune1<1:0>).

The window comparator outputs from each of the first window comparator 430 and the second window comparator 440 for each state of the first and second control lines are depicted in the next four columns 520. The logic value of the "below" output from the first window comparator 430 is shown in column 522. The logic value of the "above" output from the first window comparator 430 is shown in column 524. The logic value of the "below" output from the second window comparator 440 is shown in column 526. The logic value of the "above" output from the second window comparator 440 is shown in column 528.

When a tuning signal (e.g., tuning1<1:0>) is at a certain logic level (i.e., a logic 0 or a logic 1 and not tuning), the "above" or "below" output of the corresponding window comparator shows the state of the logic entering the logic element 450. For example, when tuning1<1:0> is at logic 0, then WC1's (the second window comparator 440) "below" output is logic 1. When tuning1<1:0> is at logic 1, then WC1's "above" output is logic 1. If tuning1<1:0> is tuning (i.e., "invert" or "tune" and not at the limiting ends of logic 0 or 1), then both "above" and "below" outputs are 0 to show that the tuning signal is at neither logic level.

By way of further example, when tuning0<1:0> is at logic 0, then WC0's (the first window comparator 430) "below" output is logic 1. When tuning0<1:0> is at logic 1, then WC0's "above" output is logic 1. When tuning0<1:0> is tuning (i.e., "invert" or "tune" and not at the limiting ends of logic 0 or 1), then both "above" and "below" outputs are 0 to show that the tuning signal is at neither logic level.

The charge pump inputs to each of the first charge pump 410 and the second charge pump 420 for each state of the first and second control lines are shown in the next four columns 530. The logic value of the second charge pump control signal (the signal on connection 453, which directs the first charge pump 410 to delay or advance the received phase error signal, appears in column 532, labeled "Inv." or invert. The logic value of the first charge pump control signal on connection 451, which enables/disables the first charge pump 410, appears in column 534, labeled "Dis." or disable. The logic value of the fourth charge pump control signal (the signal on connection 457, which directs the second charge pump 420 to delay or advance the received phase error signal, appears in column 536, labeled "Inv." The logic value of the third charge pump control signal on connection 455, which enables/disables the second charge pump 420, appears in column 538.

If a particular charge pump is tuning, then the corresponding "disable" input signal is at a logic "low" or zero. If the charge pump 410 is tuning such that voltage increases with an increase in the delay, or down direction of phase adjustment, then the corresponding charge pump is in an inverted tuning state and the "invert" input signal is at logic "high" or one. The entries within the table 500 correspond to the signals and tuning transitions illustrated in the diagram of FIG. 3B. Moving downward in the rows of the table 500 is consistent with rotation in the down direction of phase adjustment (i.e., rotating counter-clockwise) in the diagram of FIG. 3B.

A description of the location of the phase rotator 210 (FIGS. 2, 3A, 3B) for specified conditions of the first control signal (tune0<1:0>) and the second control signal (tune1<1:0>) appears in column 540.

FIG. 5B is a schematic diagram illustrating an embodiment of the relative voltages associated with the first and second control signals of FIG. 4. As explained above, both of the first and second control signals generated by the multiple-channel charge pump 230 are conveyed via a differential signal pair. As illustrated in FIG. 5B, a normal tuning range 551 for either of the control signals is symmetric about a reference 550 (e.g., 0V). The normal tuning range 551 is bounded by an upper threshold 554 and a lower threshold 560, with the upper and lower thresholds symmetric about 0V. An upper hysteresis voltage range 553 is bounded by the upper threshold 554 and an upper hysteresis threshold 552 just below the upper threshold 554. An upper range of limiting operation 555 is bounded by the upper threshold 554 and the upper swing limit 556 of the differential signal pair. A lower hysteresis voltage range 559 is bounded by the lower threshold 560 and a lower hysteresis threshold 558 just above the lower threshold 560. A lower range of limiting operation 561 is bounded by the lower threshold 560 and the lower swing limit 562 of the differential signal pair.

The following rules are applied at the transitions of the first and the second control signals. Once one of the control signals enters a limiting range of operation (e.g., the upper range of limiting operation 555), both control signals tune (i.e., the phase detector error signal is applied to both charge pump 410 and charge pump 420; for example, the state described by the $2^{nd}$ row in FIG. 5A with the description "at Clk90") until one of the control signals reenters the normal tuning range 551. For example, the normal tuning range 551 is represented by the state described in the $3^{rd}$ row in FIG. 5A with the description "Tuning Clk90 Up-Clk 180 Dn". Once one of the two control signals leaves the limiting range of operation (e.g., the control signal reenters the normal tuning range 551), the remaining control signal is directed to the end of the closest limiting range (e.g., the upper range of limiting operation 555) to prevent the remaining control signal from drifting into the normal tuning range 551 too quickly when the normal tuning signal reenters a range of limiting operation and both control signals tune. Note that the two control signals do not need to be in the same range of limiting operation (e.g., the upper range of limiting operation 555) for the rules to apply. That is, one control signal can be operating in the upper range of limiting operation 555, while the other control signal can be operating in the lower range of limiting operation 561. The combination of the above-referenced rules and the window comparator hysteresis ensures a smooth transition of tuning control between the control signals and that noise does not cause unintended transitions.

Figure 6:
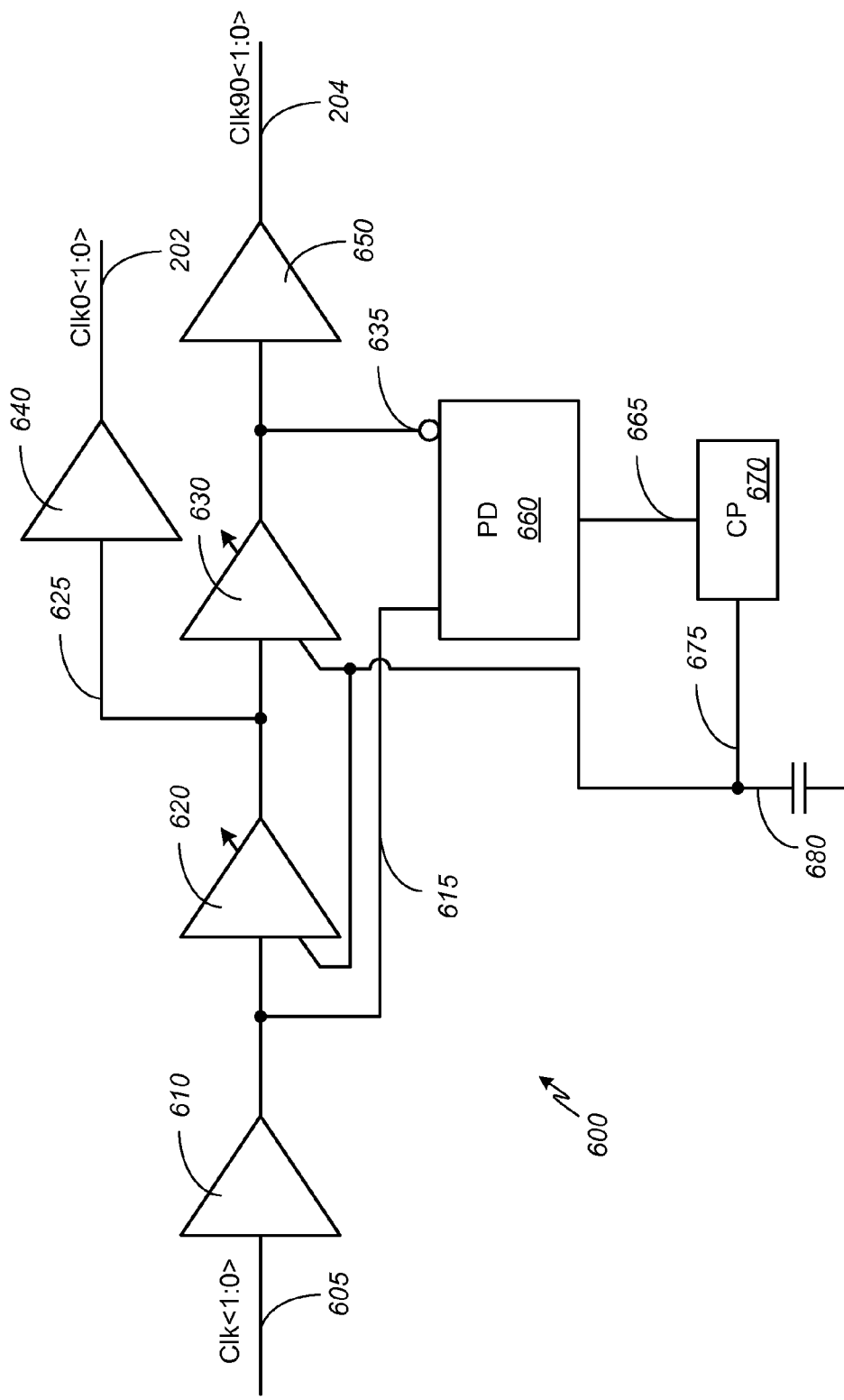
FIG. 6 is a circuit diagram illustrating an embodiment of a quadrature clock DLL suitable for coupling to the phase rotator of FIG. 2.

FIG. 6 is a circuit diagram illustrating an embodiment of a quadrature clock DLL 600 suitable for coupling to the phase rotator of FIG. 2. The quadrature clock DLL 600 includes three buffers, two delay elements, a phase detector 660 and a charge pump 670. The quadrature clock DLL 600 receives a reference clock signal (Clk<1:0>) on connection 605 and applies a first reference clock signal (Clk0<1:0>) that is in phase with the received reference clock signal (Clk<1:0>) on connection 202. In addition, a second reference clock signal (Clk90<1:0>) that is approximately 90° out-of-phase with the first reference clock signal (Clk0<1:0>) is applied on connection 204.

A first buffer 610 receives the reference clock signal (Clk<1:0>) on connection 605 and forwards the reference clock signal on connection 615 to an input of the first delay element 620 and a first input of the phase detector 660. The first delay element 620 forwards the reference clock signal delayed by 90° to the second delay element 630 and the second buffer 640 on connection 625. The second delay element 630 forwards the delayed reference clock signal to the third buffer 650 and a second input of the phase detector 660 and further delays the clock by another 90°, making the phase delay approximately 180° (or one half a clock cycle). The phase detector 660 generates a phase error signal in response to the signals on its first and second inputs (i.e., the reference clock signal and the inverse of the reference clock signal delayed by approximately one half clock cycle). The phase error signal is forwarded to the charge pump 670 via connection 665. The charge pump 670 generates a voltage in response to the phase error signal that is applied via connection 675 to a filtering capacitance 680 and control inputs of each of the first delay element 620 and the second delay element 630. When the voltage on connection 675 increases, the first delay element 620 and the second delay element 630 increase a controllable internal delay, thus delaying the phase of the first reference clock signal on connection 202 and the second reference clock signal on connection 204.

Figure 7:
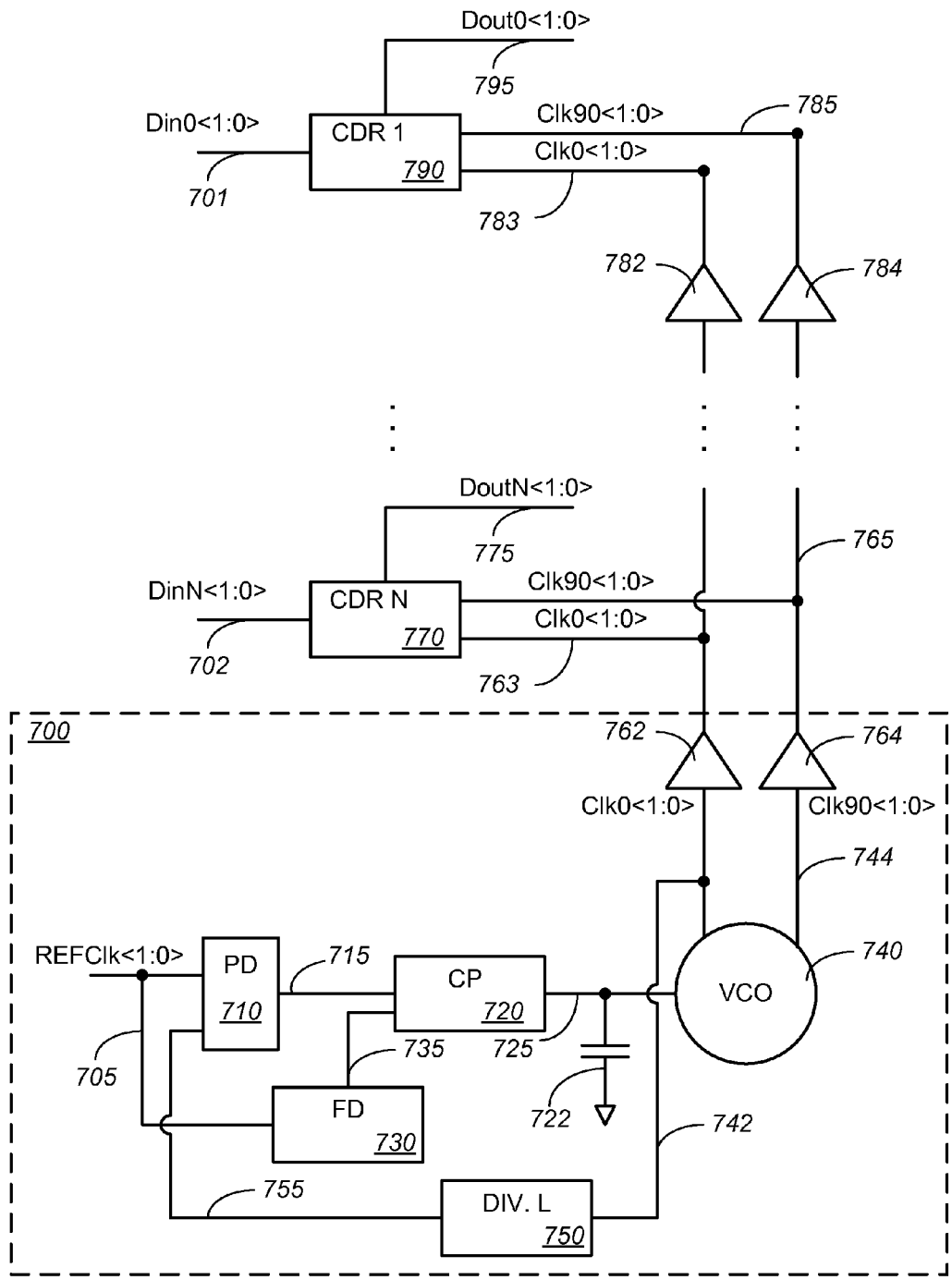
FIG. 7 is a circuit diagram illustrating an embodiment of a clock-data recovery circuit for a N-channel parallel fiber.

FIG. 7 is a circuit diagram illustrating an embodiment of a clock-data recovery circuit for an N-channel parallel fiber receiver. A clock generator 700 provides a first reference clock signal (Clk0<1:0>) and a second reference clock signal (Clk90<1:0>) that is 90° out-of-phase with the first reference clock signal to N CDR elements. Each CDR element is arranged to receive a select data channel converted by an optical to electrical signal converter (not shown).

For simplicity of illustration and description, the N parallel data channels are depicted by a first data channel including CDR 790 and an Nth data channel including CDR 770. CDR 790 receives a first data signal (Din0<1:0>) on connection 701. A first reference clock signal (Clk0<1:0>) is received on connection 785 via a buffer 784. A second reference clock signal (Clk90<1:0>) is received on connection 783 via a buffer 782. As shown in FIG. 2 and as described above, CDR 790 generates a modified data signal (Dout0<1:0>) in response to the received data signal, the first reference clock signal, and the second reference clock signal on connection 795.

CDR 770 receives an Nth data signal (DinN<1:0>) on connection 702. A first reference clock signal (Clk0<1:0>) is received on connection 765 via a buffer 764. A second reference clock signal (Clk90<1:0>) is received on connection 763 via a buffer 762. As shown in FIG. 2 and as described above, CDR 770 generates a modified data signal (DoutN<1:0>) in response to the received data signal, the first reference clock signal, and the second reference clock signal on connection 775.

The clock generator 700 receives an originating clock (REFClk<1:0>) on connection 705, which is coupled to a first input of the phase detector 710 and an input of the frequency detector 730. The charge pump 720 receives a phase error signal on connection 715 from the phase detector and a frequency error signal on connection 735 from the frequency detector. The charge pump 720 generates an output voltage that directs the VCO 740 to oscillate at a desired frequency and phase. The capacitance 722 filters the voltage on connection 725. The VCO 740 is a quadrature VCO. That is, the VCO 740 has a first output and a second output that are approximately 90° out-of-phase from each other. The first output of the VCO 740 is applied on connection 742. The second output of the VCO 740 is applied on connection 744. As further illustrated in FIG. 7, the first output of the VCO 740 is also applied via connection 742 at an input of a divider 750. The divider 750 is a circuit that divides the first output signal by an integer L. The output of the divider 750 is applied via connection 755 to a second input of the phase detector 710.

The clock-data recovery circuit for an N-channel parallel fiber illustrated in FIG. 7 is exemplary of a parallel channel receiver where a relatively stable and low frequency local clock source can be used to provide relatively stable and higher rate clock references to N CDR elements. The integer value L of the divider 750 sets the relationship between the low frequency local clock source and the higher rate reference clocks. For example, when L=4 and the local reference clock has a frequency of 100 MHz, the higher rate reference clocks will have a frequency of 400 MHz.

Figure 8:
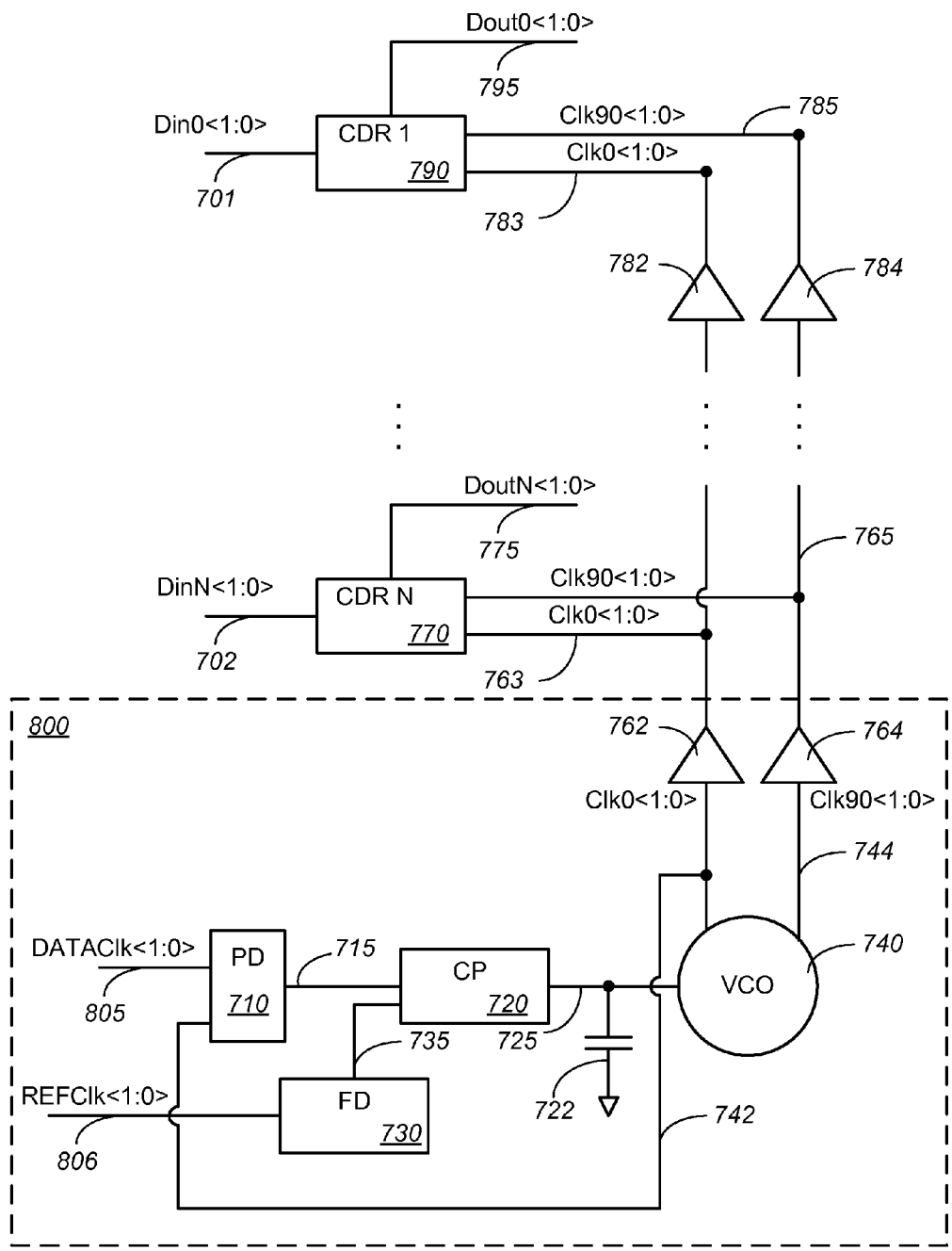
FIG. 8 is a circuit diagram illustrating an alternative embodiment of a clock-data recovery circuit for an N-channel parallel fiber.

FIG. 8 is a circuit diagram illustrating an alternative embodiment of a clock-data recovery circuit for an N-channel parallel fiber receiver. The N data channels are arranged as described above with reference to the embodiment illustrated in FIG. 7. A clock generator 800 provides a first reference clock signal (Clk0<1:0>) and a second reference clock signal (Clk90<1:0>) that is approximately 90° out-of-phase with the first reference clock signal to N CDR elements.

The clock generator 800 receives a full-rate data clock (DATAClk<1:0>) on connection 805, which is coupled to an input of the phase detector 710. The frequency detector 730 receives a reference (REFClk<1:0>) on connection 806. The reference may originate from a crystal oscillator generated clock having a similar frequency as the REFClk<1:0> applied on connection 705 in the clock generator 700 of FIG. 7. The phase detector 710 generates a phase error signal, which is forwarded to the charge pump 720 via connection 715. The charge pump 720 receives a frequency error signal on connection 735 from the frequency detector 730. The charge pump 720 generates an output voltage that directs the VCO 740 to oscillate at a desired frequency and phase. The capacitance 722 filters the voltage on connection 725. The VCO 740 is a quadrature VCO. That is, the VCO 740 has a first output and a second output that are approximately 90° out-of-phase from each other. The first output of the VCO 740 is applied on connection 742. The second output of the VCO 740 is applied on connection 744. As further illustrated in FIG. 8, the first output of the VCO 740 is also applied via connection 742 at an input of the phase detector 710. In this way the phase detector 710 generates a phase error signal that is responsive to the relative timing relationship between the data clock signal on connection 805 and the phase of the first reference clock signal on connection 742. Since the full rate data clock (i.e., DATAClk<1:0>) on connection 805 is the same frequency as the first reference clock signal (i.e., Clk0<1:0>) on connection 742 and the second clock reference (i.e., Clk90<1:0>) on connection 744, the clock generator 800 is used to clean up any jitter on the full rate data clock and to generate the quadrature clock outputs (i.e., the first and second reference clock signals).

The clock-data recovery circuit for an N-channel parallel fiber illustrated in FIG. 8 is exemplary of a parallel channel receiver where a data clock and a full-rate clock reference are available to provide relatively stable clock reference signals to N CDR elements.

Alternative embodiments for clock generators may include bulk acoustic resonators. A bulk acoustic resonator that oscillates at ¼ the desired clock rate can be coupled to a clock multiplying DLL to generate full-rate reference clocks that can be distributed to N CDR elements to recover N data signals. N-channel charge pump feedback can be added to guide the reference clock to oscillate at the average frequency of two or more of the data channels. This alternative embodiment would on average minimize the frequency difference between the data and the reference clock. When a bulk acoustic resonator is used as a frequency source, a clock multiplying PLL or DLL is used to generate the full rate clocks used by the CDR elements as presently available bulk acoustic resonators do not oscillate at a frequency that supports preferred serial communication rates.

In another embodiment, the clock generator may include four bulk acoustic resonators that oscillate at ¼ the desired clock rate. The four outputs from the bulk acoustic resonators may be applied to a clock combining circuit (e.g., a logic circuit consisting of three XOR logic gates) to generate full rate reference clocks that can be distributed to N CDR elements to recover N data signals.

In a third alternative embodiment, a separate clock generator including a bulk acoustic generator that oscillates at ¼ the desired clock rate and a clock multiplying DLL are used to provide a reference clock to each CDR in a N-channel receiver.

Figure 9:
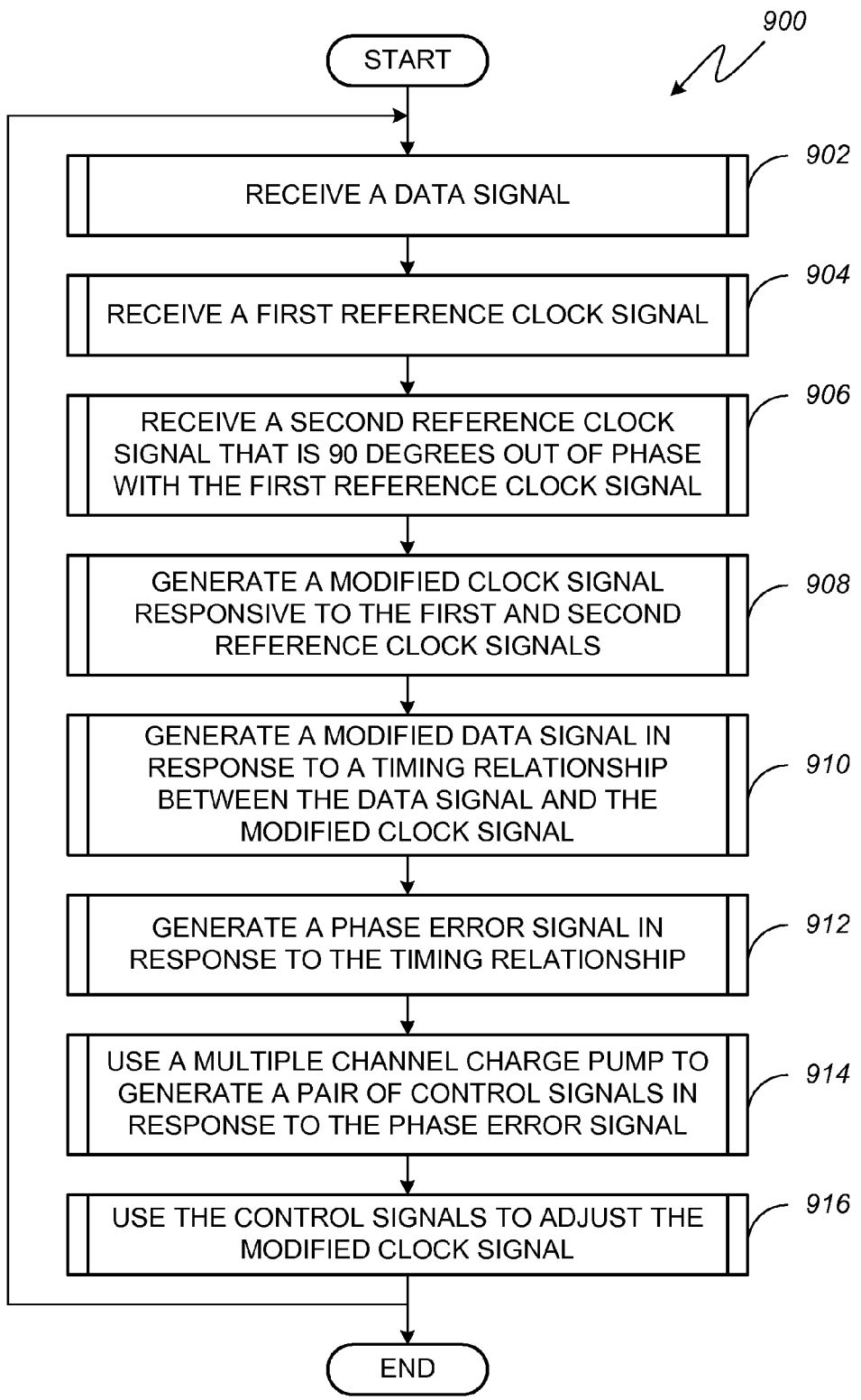
FIG. 9 is a flow diagram illustrating an embodiment of a method for clock and data recovery.

FIG. 9 is a flow diagram illustrating an embodiment of a method 900 for clock and data recovery. Method 900 begins with block 902 where a data signal is received in a communication system. In block 904, a first reference clock signal is received by the communication system. In block 906, a second reference clock signal is received by the communication system. As further indicated in block 906, the second reference clock signal is 90° out of phase with the first reference clock signal. In block 908, a modified clock signal responsive to the first and second reference clock signals is generated by the communication system. As described above, a two-stage phase rotator can be used to generate such a modified clock signal.

In block 910, a modified data signal is generated in response to a timing relationship between the data signal from block 902 and the modified clock signal from block 908. As described above, a phase detector can be used to generate the modified data signal. As indicated in block 912, a phase error signal is generated in response to a timing relationship between the data signal from block 902 and the modified clock signal from block 908. As described above, a phase detector can be used to generate the phase error signal. In block 914, a multiple channel charge pump is used to generate a pair of control signals in response to the phase error signal of block 912. In block 916, the control signals are used to adjust the modified clock signal of block 908. As indicated by the flow control arrow exiting block 916, the functions illustrated in blocks 902 through 916 are repeated as may be desired to recover clock and data signals in a communication system.

Exemplary steps for clock and data recovery are illustrated in the flow diagram of FIG. 9. The particular sequence of the steps or functions in blocks 902 through 916 is presented for illustration. It should be understood that the order of the steps or functions in blocks 902 through 916 can be performed in any other suitable order and in some cases substantially simultaneously with one another. For example, the functions in blocks 902 through 906 can be performed in any order or substantially simultaneously with one another. In addition, the functions in blocks 910 and 912 can be performed in any order or substantially simultaneously with one another.

Figure 10:
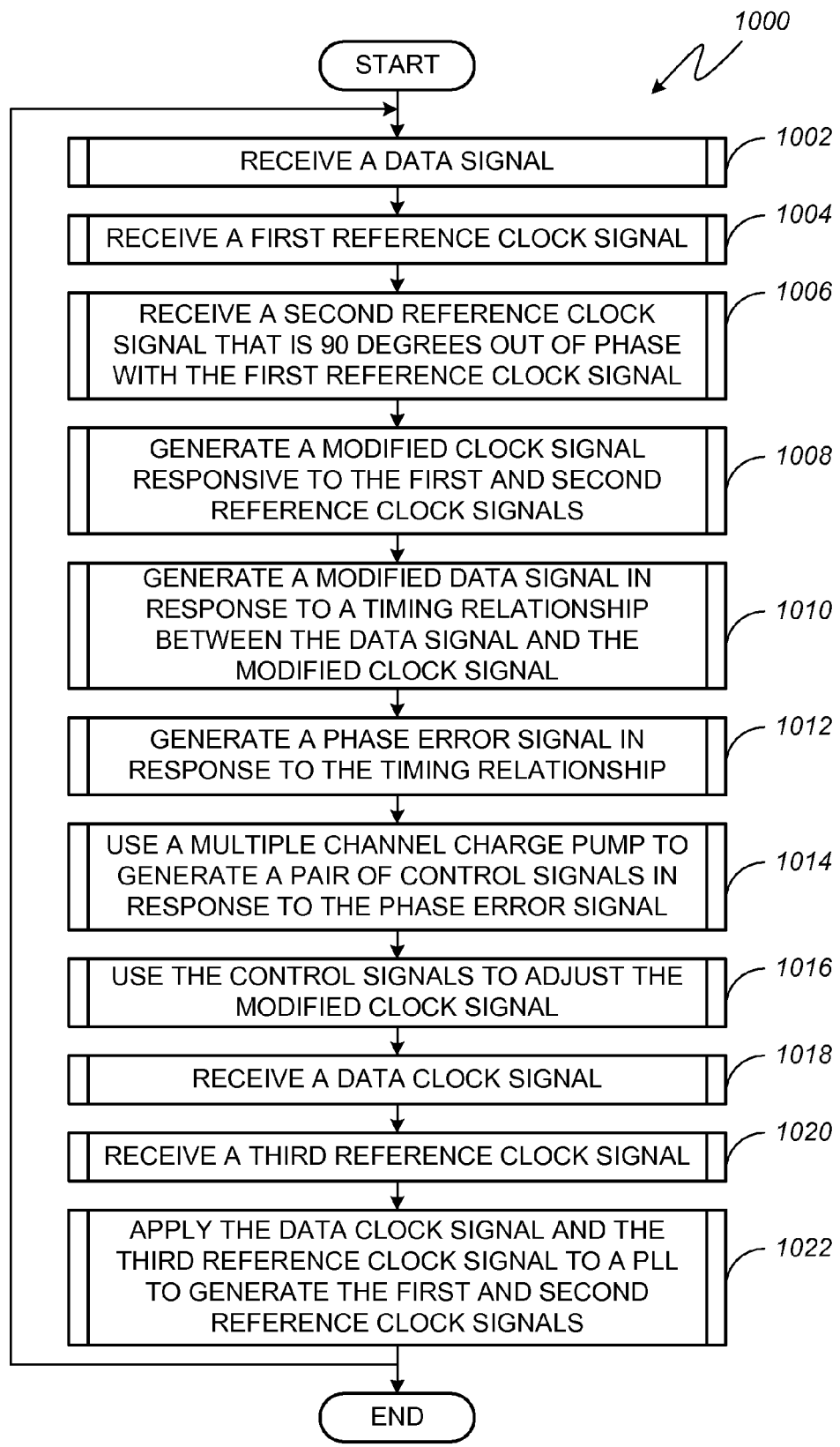
FIG. 10 is a flow diagram illustrating an alternative embodiment of a method for clock and data recovery.

FIG. 10 is a flow diagram illustrating an alternative embodiment of a method 1000 for clock and data recovery. Method 1000 begins with block 1002 where a data signal is received in a communication system. In block 1004, a first reference clock signal is received by the communication system. In block 1006, a second reference clock signal is received by the communication system. As further indicated in block 1006, the second reference clock signal is 90° out of phase with the first reference clock signal. In block 1008, a modified clock signal responsive to the first and second reference clock signals is generated by the communication system. As described above, a two-stage phase rotator can be used to generate such a modified clock signal.

In block 1010, a modified data signal is generated in response to a timing relationship between the data signal from block 1002 and the modified clock signal from block 1008. As described above, a phase detector can be used to generate the modified data signal. As indicated in block 1012, a phase error signal is generated in response to a timing relationship between the data signal from block 1002 and the modified clock signal from block 1008. As described above, a phase detector can be used to generate the phase error signal. In block 1014, a multiple channel charge pump is used to generate a pair of control signal in response to the phase error signal of block 1012. In block 1016, the control signals are used to adjust the modified clock signal of block 1008. In block 1018, a data clock is received by the communication system. In block 1020, a third reference clock signal is received by the communication system. In block 1022, the data clock and the third reference clock signals are applied to a PLL to generate the first reference clock signal and the second reference clock signal. As indicated by the flow control arrow exiting block 1022, the functions illustrated in blocks 1002 through 1022 are repeated as may be desired to recover a clock signal and a data signal in a communication system.

Exemplary steps for clock and data recovery are illustrated in the flow diagram of FIG. 10. The particular sequence of the steps or functions in blocks 1002 through 1022 is presented for illustration. It should be understood that the order of the steps or functions in blocks 1002 through 1022 can be performed in any other suitable order and in some cases substantially simultaneously with one another. For example, the functions in blocks 1002 through 1006, as well as the functions in blocks 1010 and 1012 can be performed in any order or simultaneously with one another. By way of further example, the functions in blocks 1018 and 1020 can be performed in any order or substantially simultaneously with one another.

Figure 11:
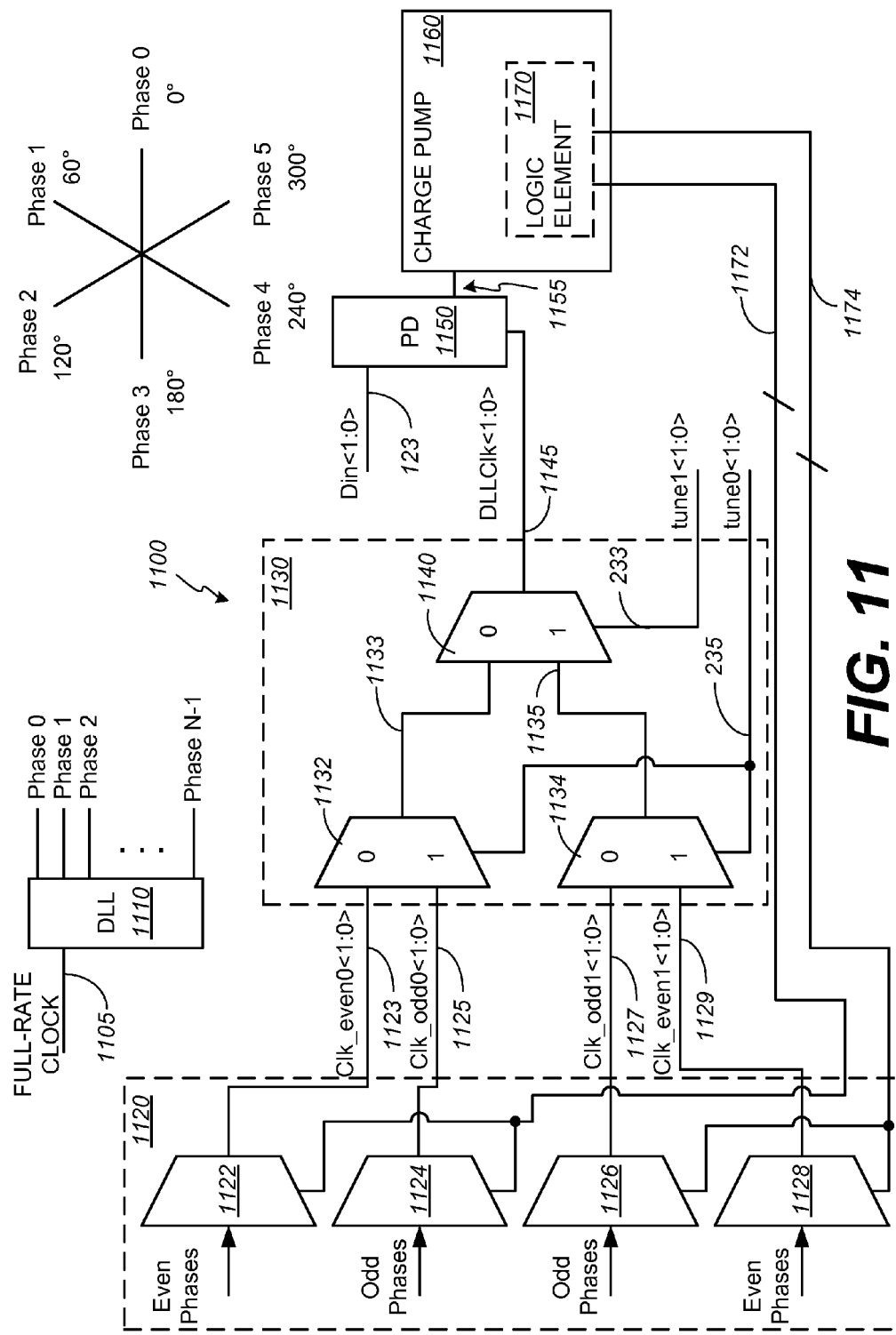
FIG. 11 is a schematic diagram illustrating an alternative embodiment of the multiple-channel charge pump of FIG. 4.

FIG. 11 is a schematic diagram illustrating an alternative embodiments of the multiple-channel charge pump of FIG. 4, the phase rotator of FIG. 3A and the DLL clock of FIG. 6. As illustrated in FIG. 11, a phase generating DLL 1110 receives a full-rate clock signal on connection 1105 and generates N clock signals shifted in phase from each other (e.g., phase 0, phase 1, phase 2, etc.). The phase generating DLL 1110 may be of similar architecture to the quadrature clock DLL 600 (FIG. 6) with additional delay elements inserted to generate the additional clock signals.

Each phase shift is approximately equal to the remaining phase shifts. An example embodiment where N=6 is illustrated in the diagram in the upper right-hand portion of FIG. 11. When N=6, each phase shift is 60°. A decrease or advance in relative phase is represented by clock-wise rotation in the diagram. An increase or delay in relative phase is represented by counter-clockwise rotation in the diagram.

The circuit 1100 includes an input stage 1120, a rotator 1130, a phase detector 1150 and charge pump 1160. The input stage 1120 is coupled to the rotator 1130 via connection 1123, connection 1125, connection 1127 and connection 1129. The rotator 1130 is coupled to a first input of the phase detector 1150 via connection 1145. The phase detector 1150 receives a data signal (Din<1:0>) at a second input and provides a phase error signal via connection 1155 to the charge pump 1160. The phase error signal is responsive to the phase difference between the received data signal and the DLL clock from the rotator 1130. The charge pump 1160 generates first and second control or tuning signals which are applied via connection 235 and connection 233 respectively to direct the rotator 1130 to interpolate between received clock signals. In addition, logic element 1170 generates a first phase select signal, which is applied via connection 1172 and a second phase select signal which is applied via connection 1174, both of which are coupled to and direct operation of the input stage 1120. The first phase select signal on connection 1172 and the second phase select signal on connection 1174 are multiple bit signals. In the case where there are three even clock phases and three odd clock phases, the first and second phase select signals are two bits each to select from each of the three input phases.

The N clock signals shifted in phase from each other are applied at the inputs to multiplexer 1122, multiplexer 1124, multiplexer 1126 and multiplexer 1128. A subset of the N clock signals with even clock phases are applied at the inputs to multiplexer 1122 and at the inputs to multiplexer 1128. Clock signals with even clock phases include phase 0, phase 2, etc. Clock signals with odd clock phases include phase 1, phase 3, etc. The remaining N clock signals with odd clock phases are applied at the inputs to multiplexer 1124 and multiplexer 1126. The multiplexers 1122, 1124, 1126, 1128 are coupled to the rotator 1130. More specifically, the output of multiplexer 1122 is coupled to the "0" input of multiplexer 1132 via connection 1123. Connection 1123 provides the Clk_even0<1:0> clock phase to the multiplexer 1132. The output of multiplexer 1124 is coupled to the "1" input of multiplexer 1132 via connection 1125. Connection 1125 provides the Clk_odd0<1:0> clock phase to the multiplexer 1132. The output of multiplexer 1126 is coupled to the "0" input of multiplexer 1134 via connection 1127. Connection 1127 provides the Clk_odd1<1:0> clock phase to the multiplexer 1134. The output of multiplexer 1128 is coupled to the "1" input of multiplexer 1134 via connection 1129. Connection 1129 provides the Clk_even1<1:0> clock phase to the multiplexer 1134. In this way, a select one of the even phase clock signals and a select one of the odd phase clock signals are applied to multiplexer 1132, while a next adjacent even phase clock signal and a next adjacent odd phase clock signal are applied to multiplexer 1134. The next adjacent even phase clock signal and the next adjacent odd phase clock signal are dependent upon whether the rotator 1130 is advancing or delaying the DLL clock.

For example, when one of multiplexer 1132 or multiplexer 1134 is interpolating between clk0 and clk60 (i.e., phase 0 and phase 1), and the rotator 1130 is delaying the clock phase (i.e., rotating counter-clockwise) toward clk60 or phase 1, the logic element 1170, via the first phase select signal and the second phase select signal, instructs the input stage 1120 to apply clk120 and clk180 (i.e., phase 2 and phase 3) at the inputs of the remaining multiplexer. Since, multiplexer 1132 and multiplexer 1134 receive clock signals or clock phases in pairs, one input to the respective multiplexer receives an even phase clock, while the remaining input receives an odd phase clock.

As indicated above, the phase rotator 1130 receives six inputs and generates a single output. The six inputs include a first control signal (tune0<1:0>) on connection 235, a second control signal (tune1<1:0>) on connection 233, a first even phase clock signal on connection 1123, a first odd phase clock signal on connection 1125, a second odd phase clock signal on connection 1127 and a second even phase clock signal on connection 1129. The phase rotator 1130 generates a DLL clock signal (DLLClk<1:0>) on connection 1145. Although the first and second control signals and the odd and even phase clock signals are described as differential signals, a single-ended implementation can be substituted for the first and second control signals or the odd and even phase clock signals.

A first input of the first multiplexer 1132 receives the first even phase clock signal on connection 1123. A second input of the first multiplexer 1132 receives the first odd phase clock signal on connection 1125. A control input of the first multiplexer 1132 receives the first control signal (tune0<1:0>) on connection 235. A first input of the second multiplexer 1134 receives the second odd phase clock signal on connection 1127. A second input of the second multiplexer 1134 receives the second even phase clock signal on connection 1129. The first multiplexer 1132 and the second multiplexer 1134 are tuning elements that can select one of the inputs or can interpolate between the input signals. When the first control signal (tune0<1:0>) is operating in a limiting range of operation, the multiplexer 1132 will select one of its inputs depending on the polarity of the first control signal and forward a select one of the first even phase clock signal and the first odd phase clock signal on connection 1133. For example, the multiplexer 1132 will select the input labeled "1" when the control signal is positive and the input labeled "0" when the control signal is negative.

When the first control signal (tune0<1:0>) is operating in a linear range of operation, the multiplexer 1132 interpolates between the first even phase clock signal and the first odd phase clock signal. Similarly, when the first control signal (tune0<1:0>) is operating in a limiting range of operation, the multiplexer 1134 will select one of its inputs depending on the polarity of the first control signal and forward a select one of the second odd phase clock signal and the second even phase clock signal on connection 1135. The multiplexer 1134 will select the input labeled "1" when the control signal is positive and the input labeled "0" when the control signal is negative.

When the first control signal (tune0<1:0>) is operating in a linear range of operation, the multiplexer 1134 interpolates between the second odd phase clock signal and the second even phase clock signal. When the second control signal (tune1<1:0>) is operating in a limiting range of operation, the multiplexer 1140 will select one of its inputs depending on the polarity of the second control signal and forward a select one of the signal on connection 1133 or the signal on connection 1135. The multiplexer 1140 will select the input labeled "1" when the control signal is positive and the input labeled "0" when the control signal is negative.

When the second control signal (tune1<1:0>) is operating in a linear range of operation, the multiplexer 1140 interpolates between the signal on connection 1133 and the signal on connection 1135.

It should be understood that while the illustrated embodiment includes an input stage 1120 with multiplexers that receive groups of signals with paired clock phases and a rotator 1130 that interpolates between an even number of clock phases, other implementations are possible. For example, if the input stage multiplexers were configured to receive each of the N clock signals for selection, then the circuit 1100 could be arranged to controllably adjust the DLL clock signal over an odd number of clock phases.

While various embodiments of the circuits and methods for clock and data recovery have been illustrated and described, it will be apparent to those of ordinary skill in the art that many more embodiments and implementations are possible that are within the scope of this disclosure. Accordingly, the described circuits and methods are not to be restricted or otherwise limited except in light of the attached claims and their equivalents.

What is claimed:

1. A clock-data recovery circuit, comprising:
  a phase rotator configured to generate a modified clock signal responsive to a first reference clock signal, a second reference clock signal and first and second control signals;
  a phase detector configured to receive the modified clock signal and a data signal, the phase detector further configured to generate a modified data signal and a phase adjustment signal responsive to the modified clock signal and the data signal; and
  a charge pump configured to receive the phase adjustment signal and generate the first and second control signals, wherein the charge pump comprises a first tuning channel and a second tuning channel, the first tuning channel using a first window comparator configured to generate a first window comparator output and a second window comparator output, the first window comparator output responsive to a first condition when the phase adjustment signal is above a first threshold value, the second window comparator output responsive to a second condition when the phase adjustment signal is below a second threshold value.

2. The clock-data recovery circuit of claim 1, wherein the phase rotator comprises a first stage and a second stage.

3. The clock-data recovery circuit of claim 2, wherein the first stage comprises a pair of multiplexers.

4. The clock-data recovery circuit of claim 2, wherein the second stage comprises a third multiplexer.

5. The clock-data recovery circuit of claim 2, wherein the first reference clock signal and the second reference clock signal are offset approximately 90° with respect to each other.

6. The clock-data recovery circuit of claim 5, wherein emitter degeneration resistors are added to the control input.

7. The clock-data recovery circuit of claim 1, wherein the second tuning channel comprises a second window comparator configured to generate a third window comparator output and a fourth window comparator output, the third window comparator output responsive to a third condition when the phase adjustment signal is above a third threshold value, the fourth window comparator output responsive to a fourth condition when the phase adjustment signal is below a fourth threshold value.

8. The clock-data recovery circuit of claim 1, wherein the charge pump further comprises a logic element configured to receive a first window comparator output, a second window comparator output, a third window comparator output and a fourth window comparator output, the logic element configured to select which of the first tuning channel and the second tuning channel is enabled and in which direction to implement gray code tuning.

9. A method for clock-data recovery, comprising:
  receiving a data signal;
  receiving a first reference clock signal;
  receiving a second reference clock signal 90° out of phase with the first reference clock signal;
  generating a modified clock signal responsive to the first and second reference clock signals;
  generating a modified data signal responsive to a timing relationship between the data signal and the modified clock signal;
  generating a phase error signal responsive to the timing relationship;
  using a multiple channel charge pump responsive to the phase error signal to generate a pair of control signals, the multiple channel charge pump using a first window comparator and a second window comparator to identify the relative position of the pair of control signals with respect to multiple threshold values; and
  using the control signals to adjust the modified clock signal.

10. The method of claim 9, wherein the first reference clock signal and the second reference clock signal are generated via a circuit comprising a delay-locked loop.

11. The method of claim 9, wherein the first reference clock signal and the second reference clock signal are generated via a quadrature voltage-controlled oscillator.

12. The method of claim 9, further comprising:
receiving a data clock;
receiving a third reference clock; and
applying the data clock and the third reference clock to a phase-locked loop having a voltage-controlled oscillator to generate the first reference clock signal and the second reference clock signal.

13. The method of claim 9, further comprising:
coupling the first reference clock signal and the second reference clock signal to more than one clock-data recovery circuit.

14. The method of claim 9, wherein the first and second reference clock signals are responsive to a bulk-acoustic resonator.

15. The method of claim 9, wherein the first window comparator generates a first window comparator output responsive to a first condition when the phase error signal is above a first threshold value and a second window comparator output responsive to a second condition when the phase error signal is below a second threshold value.

16. The method of claim 9, wherein the second window comparator generates a third window comparator output responsive to a third condition when the phase error signal is above a third threshold value and a fourth window comparator output responsive to a fourth condition when the phase error signal is below a fourth threshold value.

17. The method of claim 9, wherein using a multiple channel charge pump further comprises applying output signals from the first window comparator and the second window comparator to a logic element.

\* \* \* \* \*